(12) United States Patent
Kapusta et al.

(10) Patent No.: US 6,706,624 B1
(45) Date of Patent: Mar. 16, 2004

(54) METHOD FOR MAKING MULTICHIP MODULE SUBSTRATES BY ENCAPSULATING ELECTRICAL CONDUCTORS

(75) Inventors: Christopher James Kapusta, Duanesburg, NY (US); Thomas Bert Gorczyca, Schenectady, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 86 days.

(21) Appl. No.: 10/100,658

(22) Filed: Mar. 18, 2002

Related U.S. Application Data

(60) Provisional application No. 60/339,969, filed on Oct. 31, 2001.

(51) Int. Cl.[7] ............... H01L 21/4763; H01L 21/301; H01L 23/34; H01L 23/12; H01L 23/48
(52) U.S. Cl. ............... 438/622; 257/723; 257/758; 257/704; 438/622; 438/464
(58) Field of Search ................. 257/704, 723, 257/758; 438/622, 464

(56) References Cited

U.S. PATENT DOCUMENTS

| | | | | |
|---|---|---|---|---|
| 4,783,695 A | | 11/1988 | Eichelberger et al. ........ 357/65 |
| 5,048,179 A | * | 9/1991 | Shindo et al. ............... 29/840 |
| 5,049,980 A | * | 9/1991 | Saito et al. ................. 257/758 |
| 5,073,814 A | * | 12/1991 | Cole et al. .................. 257/643 |
| 5,144,747 A | * | 9/1992 | Eichelberger ............... 29/834 |
| 5,338,975 A | * | 8/1994 | Cole et al. .................. 257/750 |
| 5,359,496 A | * | 10/1994 | Kornrumpf et al. .......... 361/795 |
| 5,373,627 A | * | 12/1994 | Grebe ......................... 29/841 |
| 5,422,514 A | * | 6/1995 | Griswold et al. ............ 257/679 |
| 5,452,182 A | * | 9/1995 | Eichelberger et al. ....... 361/749 |
| 5,739,585 A | * | 4/1998 | Akram et al. ............... 257/698 |
| 5,757,072 A | * | 5/1998 | Gorowitz et al. ............ 257/700 |
| 5,808,878 A | * | 9/1998 | Saito et al. ................. 361/818 |
| 6,274,391 B1 | * | 8/2001 | Wachtler et al. ............. 438/6 |
| 6,555,906 B2 | * | 4/2003 | Towie ......................... 257/723 |

FOREIGN PATENT DOCUMENTS

EP    488574 A   *   6/1992

* cited by examiner

Primary Examiner—David E. Graybill
Assistant Examiner—James Mitchell
(74) Attorney, Agent, or Firm—Duane Morris LLP

(57) ABSTRACT

A method for making a multichip "HDI" module includes the step of making a substrate for supporting the semiconductor or solid-state chips by applying electrical conductor in a pattern to a first dielectric sheet, and applying encapsulating material to the electrical conductor. Apertures are made in the first dielectric sheet at locations at which the chips are to be located. The chips are affixed to a second dielectric sheet at locations registered with the apertures in the first sheet, and the sheets are juxtaposed with the chips extending into the apertures. Electrical connection is made to the pads of the chips by means of a multilayer structure of dielectric sheets with conductor patterns, interconnected by means of plated-through vias.

6 Claims, 3 Drawing Sheets

METHOD FOR MAKING MULTICHIP MODULE SUBSTRATES BY ENCAPSULATING ELECTRICAL CONDUCTORS

CROSS REFERENCE TO RELATED APPLICATION

This application relates to and claims the benefit of the earlier filing date under 35 U.S.C. 119, of U.S. Provisional Patent Application, Serial Number 5 60/339,969 entitled "Method for Making Multichip Module Substrates by Encapsulating Electrical Conductors," filed on Oct. 31, 2001.

FIELD OF THE INVENTION

This invention relates to fabrication of high density interconnect (HDI) modules, and more particularly to methods for making multichip modules by using a substrate made by encapsulating electrical conductors.

BACKGROUND OF THE INVENTION

High density interconnect assemblages such as those described in U.S. Pat. No. 4,783,695, issued Nov. 8, 1988 in the name of Eichelberger et al., and in numerous other patents, are finding increased usage. In one form of HDI assemblage, a dielectric substrate such as alumina has a planar surface and one or more wells or depressions. Each well or depression extends below the planar surface by the dimension of a component which is to become part of the HDI assemblage. The component is typically an integrated circuit, having its electrical connections or contacts on an upper surface. Each component is mounted in a well dimensioned to accommodate the component with its contacts in substantially the same plane as the planar surface of the substrate. The components are typically held in place in their wells or depressions by an epoxy adhesive. A layer of dielectric material such as Kapton polyimide film, manufactured by DuPont of Wilmington, Del., is laminated to the devices using ULTEM polyetherimide thermoplastic adhesive, manufactured by General Electric Plastic, Pittsfield, Mass., which is then heat-cured at about 260° to 300° C. in order to set the adhesive.

The polyetherimide adhesive is advantageous in that it bonds effectively to a number of metallurgies, and can be applied in a layer as thin as 12 micrometers ($\mu$m) without formation of voids. Further, it is a thermoplastic material, so that later removal of the polyimide film from the components is possible for purposes of repair by heating the structure to the glass transition temperature of the polyetherimide while putting tension on the polyimide film.

Another known method for making HDI modules includes applying the chips, electrode-side-down, onto an adhesive-faced dielectric layer. The chips are then encapsulated in a rigid material, which in one embodiment is Plaskon, an epoxy material, to form a rigid molded-chip-plus-dielectric-sheet piece. The electrical interconnections are made by means of laser-drilled vias through the dielectric sheet, followed by patterned deposition of electrically conductive metallization.

SUMMARY OF THE INVENTION

A method according to one aspect of the invention is for generating a multi-chip module. The method comprises the steps of procuring a dielectric sheet defining a surface, and tensioning the dielectric sheet to provide a measure of rigidity to the surface. One or more electrical conductors is applied to the surface of the dielectric sheet in a predetermined pattern. The electrical conductors have a predetermined thickness. In one embodiment of the invention, the thickness is 40 thousandths of an inch (0.040"), and the surface of the dielectric sheet is coated with adhesive to retain the conductors. Encapsulating material is applied to the surface of the dielectric sheet in a thickness sufficient to encapsulate the electrical conductors, to thereby generate a rigid substrate element. Apertures, which may be through apertures, are fabricated, formed or defined in the rigid substrate element at predetermined locations at which semiconductor or solid-state chips are to be placed in or on the multi-chip module. The semiconductor chips are placed on a second dielectric substrate at locations registered with the apertures or through apertures, with electrical interconnects of the chips facing in a particular direction. In a particular embodiment of the invention, the second dielectric sheet has adhesive on one of its surfaces, and that side of the semiconductor or solid-state chips having electrical connection pads or electrodes of the semiconductor or solid-state chips are placed on the adhesive of the second sheet. The rigid substrate element is affixed to the second dielectric sheet with the semiconductor or solid-state chips extending into or through the apertures. A flexible multilayer dielectric interconnection sheet carrying interconnection conductor patterns is applied over at least the electrical connection pads or electrodes of some of the semiconductor or solid-state chips, for making connections between at least some of the interconnection conductor patterns of the interconnection sheet and some of the electrical connection pads. In a particular embodiment of the invention, the connections are made with the aid of plated-through vias.

In one variant of the method, a layer of encapsulant material is removed or shaved from at least one surface of the rigid substrate element before the step of affixing the rigid substrate element to the second dielectric sheet. In another variant, the step of applying to the surface of the dielectric sheet, in a predetermined pattern, one or more electrical conductors having a predetermined thickness includes the step of applying adhesive to the surface of the dielectric sheet, and applying the one or more electrical conductors to the adhesive. In another mode of the method of the invention, an electrically or thermally conductive plate is affixed to the rigid substrate element on that side of the multichip module remote from the flexible multilayer dielectric interconnection sheet.

DESCRIPTION OF THE INVENTION

Figure 1A:
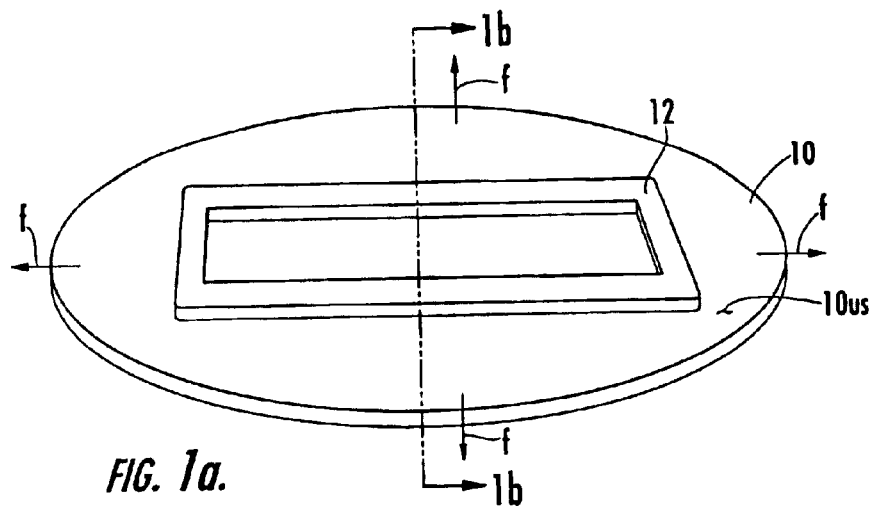
FIG. 1a is a simplified perspective or isometric view of a tensioned dielectric sheet onto which conductive slug material has been affixed.
Figure 1B:
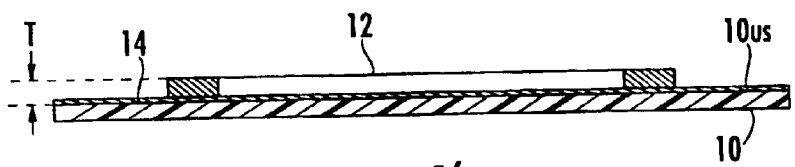
FIG. 1b is a cross-section of the structure of FIG. 1a looking in the direction 1b—1b.

In FIGS. 1a and 1b, a tensioned dielectric sheet 10 defines an upper surface 10us. The tensioning may be applied by way of a frame, as known in the art, to produce a radial outward force indicated by arrows f. The upper surface 10us may be coated with adhesive. A layer of electrically conductive material 12 is affixed to the upper surface 10us of dielectric sheet 10, as for example by application of a layer 14 of adhesive to the upper surface 10us. Conductive layer 12 may have any thickness T, but in one embodiment of the invention, has a thickness of 0.040 inch. Such a thickness of material may possibly be better fabricated by stamping rather than by deposition, but any method will do, including machining from a block of conductive metal. As illustrated, the conductive pattern is in the form of an open rectangle or surrounding wall. Such a pattern can be useful in the context of electrically shielding components lying within the enclosed portion. Such a shape may also be useful for grounding electrical circuits, especially if the electrically conductive piece 12 is itself connected to an external ground.

Figure 2:
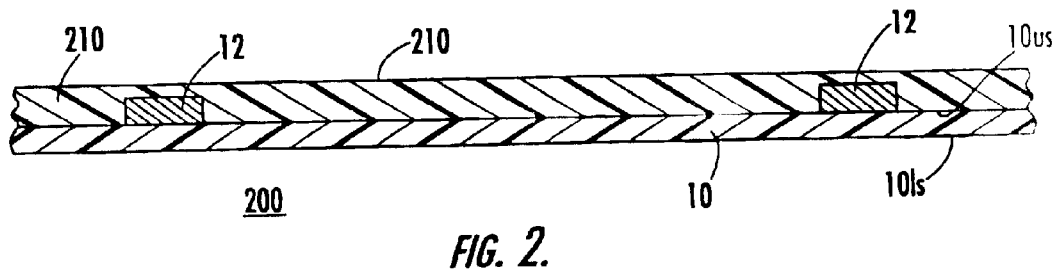
FIG. 2 is a simplified cross-section of the structure of FIGS. 1a and 1b after encapsulation.

In FIG. 2, the structure of FIG. 1b has been covered with a layer of encapsulating or fill material 210. In one embodiment, the encapsulating material is the abovementioned Plaskon material. Once the encapsulating material is hardened, the layer becomes rigid to thereby define a rigid substrate element 200, although the thickness of the element is such that it may be somewhat flexible overall. As illustrated in FIG. 2, the encapsulating material 210 fills the region between the exposed portions of the electrically conductive material 12. As illustrated in FIG. 2, the layer 210 of encapsulant material may be thick enough to extend over the electrically conductive portions 12.

Figure 3:
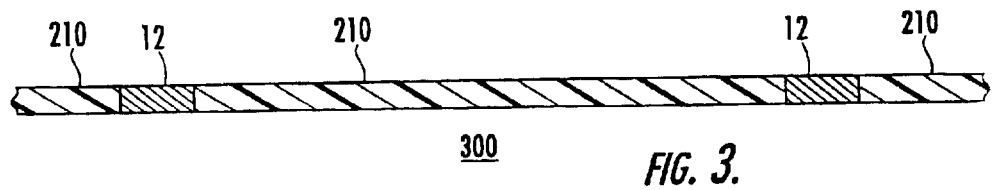
FIG. 3 is a simplified cross-section of the structure of FIG. 2 after removal of excess encapsulation and dielectric sheet.

FIG. 3 is a simplified cross-sectional view of the structure of FIG. 2 after the step of grinding or lapping both upper and lower surfaces of the structure to thereby expose the electrically conductive portions 12 at both surfaces.

Figure 4A:
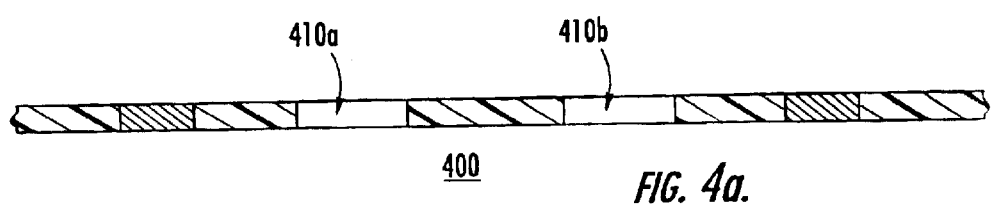
FIG. 4a is a simplified cross-sectional view, and FIG. 4b a simplified perspective or isometric view, of the structure of FIG. 3 after the defining of apertures for placement of chips.
Figure 4B:
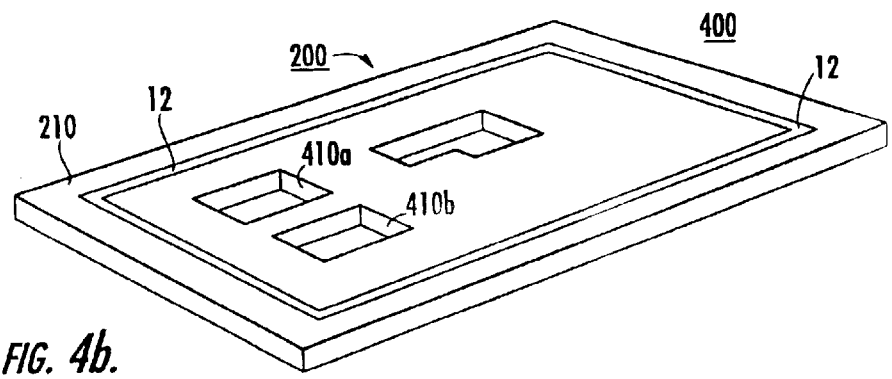

FIGS. 4a and 4b illustrate the result of forming apertures 410a and 410b within the region which is electrically shielded by the presence of electrically conductive slug 12. The apertures are dimensioned to accommodate the various semiconductor or solid-state chips (chips) which are intended for mounting therein.

Figure 5:
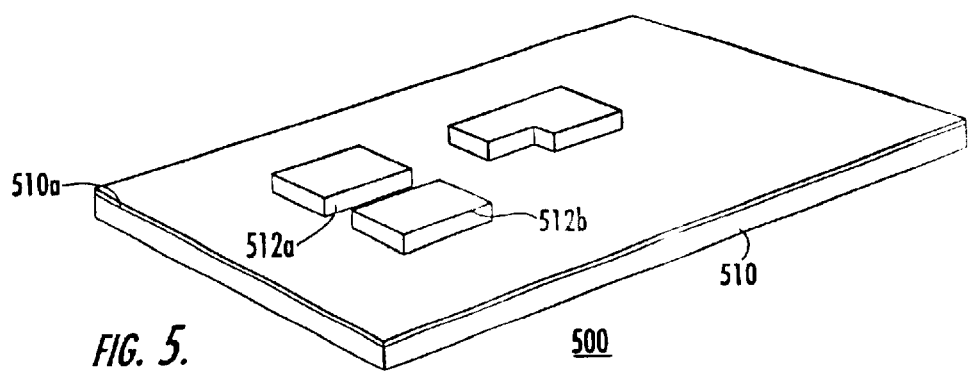
FIG. 5 is a simplified perspective or isometric view of another dielectric sheet with semiconductor or solid-state chips mounted thereon in a pattern registered with the apertures of the structure of FIGS. 4a and 4b.

FIG. 5 illustrates a structure 500 including a sheet 510 of dielectric material on which a plurality of semiconductor or solid-state chips, two of which are designated 512a and 512b, are mounted. The mounting may be accomplished by applying adhesive to either the electrical connection sides of the chips or to the dielectric sheet 510, and bringing the chips into contact with the dielectric sheet 510. The locations of the chips are selected to be registered with each other and with the apertures 410a and 410b in structure 400 of FIGS. 4a and 4b.

Figure 6:
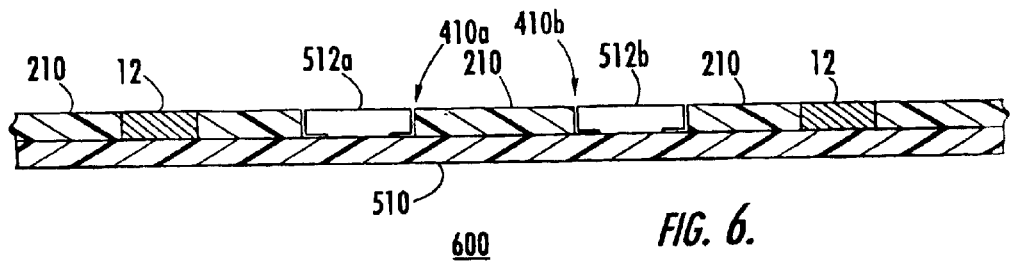
FIG. 6 is a simplified cross-sectional view of the structure of FIGS. 4a and 4b juxtaposed with that of FIG. 5.

FIG. 6 is a cross-sectional view of the combined structures 400 of FIG. 4 with 500 of FIG. 5. In FIG. 6, the semiconductor or solid-state chip 512a lies within aperture 410a, and chip 512b lies within aperture 410b. The resulting structure is designated 600.

Figure 7:
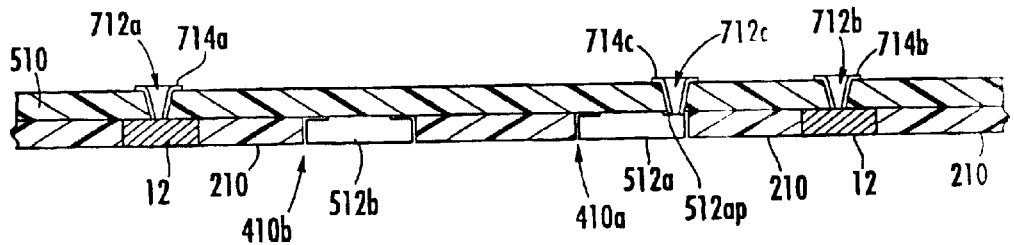
FIG. 7 is a simplified cross-sectional view of the structure of FIG. 6, with the addition of through vias and circuit metallizations or depositions.

FIG. 7 illustrates the structure 600 of FIG. 6, turned over for convenience in understanding, with layer 510 of dielectric material lying above the remaining structure. As illustrated in FIG. 7, through vias 712a, 712b, and 712c are made in the conventional manner through dielectric material 510 at the locations of the conductive slugs 12 and at the location of a contact pad 512ap of semiconductor or solid-state chip 512a. Metallizations 714a and 714b overlie the locations of electrically conductive slugs 12, while metallization 714c overlies one of the electrical contacts or pads of semiconductor or solid-state chip 512a.

Figure 8:
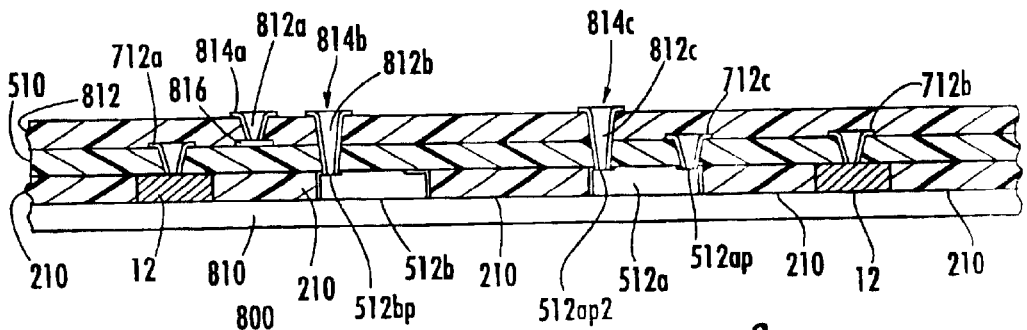
FIG. 8 is a simplified cross-sectional view of a completed multi-chip module according to an aspect of the invention, including a ground/thermal coupling plate.

FIG. 8 is a cross-sectional view of a structure 800 built up from structure 700 of FIG. 7. Structure 800 includes a further heat-sink layer 810 affixed to the bottom of structure 700, and thermally coupled at least to the lower surfaces of semiconductor or solid-state chips 512a and 512b, for aiding in carrying away heat therefrom. Alternatively, or in addition, the heat sink layer 810 can be electrically conductive, and be in galvanic contact with the electrically conductive slugs 12. In addition, a further dielectric interconnect layer 812 is affixed to the upper surface of layer 510. Interconnect layer 812 includes further through vias and metallizations, for making other connections. More particularly, dielectric interconnect layer 812 has through vias and metallizations 814a, 814b, and 814c made therethrough at locations of an intermediate-level connection pad 816, and at the locations of contact pads 512bp and 512ap2.

Other embodiments of the invention will be apparent to those skilled in the art. For example, while the pattern of the conductor in the described example is a simple open rectangle, any planar shape, however complex, may be used. There is no need for the various portions of the conductor to be contiguous (that is to say, in direct or galvanic electrical contact). The pattern may also be exposed, in some or all areas, to the edge of the molded substrate. In addition to the pattern, other components, such as resistors, capacitors, or other passive or active components which can be completely encapsulated without detrimental effect, may be added to the original dielectric sheet and encapsulated into the structure together with the metal pattern. Such items or components might be thinner that the final substrate thickness so as not to interfere with grinding, if used. It would probably be easier to have the passive parts added during the substrate structure formation, thus eliminating the need to open up apertures for them later; on the other hand, one aperture could accommodate more than one component . . . that is, the structure formed may have only one aperture which fits over a plurality, or all the active and passive components applied to the second dielectric sheet. Open space left in the aperture is optionally filled with a suitable material after placement of the structure over the components. Removal of the dielectric sheet used to form the substrate or removal of excess molding material, if present, is optional. A metal interconnect may be optionally placed onto the substrate to form an interconnect structure between the metal pattern and added components and provide pads for further interconnect integration with the second dielectric sheet onto which it is placed. After placement of the structure over the semiconductor chips and components on flex, the remaining open space within the apertures formed to accommodate the components may be optionally filled with a suitable material.

Thus, a method according to an aspect of the invention is for generating a multi-chip module (800). The method comprises the steps of procuring a dielectric sheet (10) defining a surface (10us) and tensioning (f) the dielectric sheet, as by use of a frame, to provide a measure of rigidity to the surface (10us). One or more electrical conductors (12) is applied to the surface (10us) of the dielectric sheet (10) in a predetermined pattern. The electrical conductors (12) have a predetermined thickness. In one embodiment of the invention, the thickness is 40 thousandths of an inch, and the surface of the dielectric sheet is coated with adhesive (14) to retain the conductors (12). Encapsulating material (210) is applied to the surface of the dielectric sheet in a thickness sufficient to encapsulate the electrical conductors (12), to thereby generate a rigid substrate element (200). Apertures, which may be through apertures (410a, 410b), are fabricated, formed or defined in the rigid substrate element 200 at predetermined locations at which semiconductor or solid-state chips (512a, 512b) are to be placed in or on the multi-chip module (800). The semiconductor or solid-state chips (410a, 410b) are placed on a second dielectric sheet or substrate (510) at locations registered with the apertures or through apertures (410a, 410b), with electrical pads, electrodes, or interconnects (512ap, 512ap2, 512bp) of the chips (410a, 410b) facing in a particular direction. In a particular embodiment of the invention, the second dielectric sheet (510) has adhesive (510a) on one of its surfaces, and that side of the semiconductor or solid-state chips (410a, 410b) having electrical connection pads or electrodes (512ap, 512ap2, 512bp) of the semiconductor or solid-state chips (410a, 410b) are placed on the adhesive (510a) of the second sheet. (510). The rigid substrate element with apertures (400) is affixed to the second dielectric sheet (510) with the semiconductor or solid-state chips (410a, 410b) extending into or through the apertures (410a, 410b). A flexible multilayer dielectric interconnection sheet carrying interconnection conductor patterns (510, 812) is formed on, andor applied over, at least the electrical connection pads or electrodes (512ap, 512ap2, 512bp) of some of the semiconductor or solid-state chips (410a, 410b), for making connections between at least some of the interconnection conductor patterns (714a, 714b, 714c, 814a, 814b, 814c) of the interconnection sheet (510, 812) and some of the electrical connection pads (512ap, 512ap2, 512bp). In a particular embodiment of the invention, the connections are made with the aid of plated-through vias (712a, 712b, 712c, 814a, 814b, 814c).

In one variant of the method, a layer of encapsulant material is removed, shaved or ground from at least one surface of the rigid substrate element (200) before the step of affixing the rigid substrate element to the second dielectric sheet. In another variant, the step of applying to the surface (10us) of the dielectric sheet 910), in a predetermined pattern, one or more electrical conductors (12) having a predetermined thickness includes the step of applying adhesive (14) to the surface (10us) of the dielectric sheet (10), and applying the one or more electrical conductors (12) to the adhesive (14). In another mode of the method of the invention, an electrically conductive plate (810) is affixed to the rigid substrate element (300) on that side of the multichip module (800) remote from the flexible multilayer dielectric interconnection sheet (510, 812).

What is claimed is:

1. A method for generating a multi-chip module, said method comprising the steps of:

procuring a dielectric sheet defining a surface;

tensioning said dielectric sheet to provide a measure of rigidity to said surface thereof;

applying to said surface of said dielectric sheet, in a predetermined pattern, one or more electrical conductors having a predetermined thickness;

applying encapsulating material to said surface of said dielectric sheet in a thickness sufficient to encapsulate said electrical conductors to thereby generate a rigid substrate element;

fabricating apertures in said rigid substrate element at predetermined locations at which chips are to be placed on said multi-chip module;

placing chips on a second dielectric substrate at locations registered with said apertures, with electrical interconnects of said chips facing in a particular direction;

affixing said rigid substrate element to said second dielectric sheet with said chips extending into said apertures; and applying a flexible multilayer dielectric interconnection sheet over at least said electrical interconnects of said chips, and making connections between at least some of the interconnects of said interconnection layer and some of said electrical interconnects of said chips.

2. A method according to claim 1, further including the step of removing encapsulating material from at least one surface of said rigid substrate element before said step of affixing said rigid substrate element to said second dielectric sheet.

3. A method according to claim 1, wherein said step of applying to said surface of said dielectric sheet, in a predetermined pattern, one or more electrical conductors having a predetermined thickness includes the step of applying adhesive to said surface of said dielectric sheet and applying said one or more electrical conductors to said adhesive.

4. A method according to claim 1, further comprising the step of affixing an electrically conductive plate to that side of said rigid substrate element remote from said flexible multilayer dielectric interconnection sheet, with said plate in at least one of (a) electrical contact with one of said electrical conductors and (b) in thermal contact with at least one of said semiconductor or solid-state chips.

5. A method according to claim 1, wherein said step of forming apertures comprises the step of forming through apertures.

6. A method according to claim 1, wherein said step of fabricating apertures in said rigid substrate element is additionally performed at predetermined locations at which passive components are to be placed on said multi-chip module; and comprising the additional step of placing at least one passive component on said second dielectric substrate at a location registered with, or at least within, one of said apertures.

* * * * *